United States Patent
Op De Beeck

(10) Patent No.: US 7,683,704 B2
(45) Date of Patent: Mar. 23, 2010

(54) MULTIPLE ORDER LOW PASS FILTER FOR AN XDSL SPLITTER IN A TELECOMMUNICATION SYSTEM

(75) Inventor: Edmond Op De Beeck, Mechelen (BE)

(73) Assignee: Alcatel Lucent, Paris (FR)

( * ) Notice: Subject to any disclaimer, the term of this patent is extended or adjusted under 35 U.S.C. 154(b) by 245 days.

(21) Appl. No.: 11/855,106

(22) Filed: Sep. 13, 2007

(65) Prior Publication Data
US 2008/0074178 A1 Mar. 27, 2008

(30) Foreign Application Priority Data
Sep. 22, 2006 (EP) .................................. 06291502

(51) Int. Cl.
H04B 1/10 (2006.01)
H04M 1/00 (2006.01)
H04M 11/00 (2006.01)
(52) U.S. Cl. ...................................................... 327/558
(58) Field of Classification Search .................. 327/558
See application file for complete search history.

(56) References Cited

U.S. PATENT DOCUMENTS

| | | | |
|---|---|---|---|
| 4,594,648 A | 6/1986 | Gallios | |
| 5,530,396 A | 6/1996 | Vlatkovic et al. | |
| 6,608,842 B2 * | 8/2003 | Michaels | 370/493 |
| 6,694,013 B1 * | 2/2004 | Lofmark | 379/399.01 |

FOREIGN PATENT DOCUMENTS

| | | |
|---|---|---|
| DE | 19713449 A1 | 10/1998 |
| EP | 1686678 A1 | 8/2006 |

* cited by examiner

*Primary Examiner*—Lincoln Donovan
*Assistant Examiner*—Terry L Englund
(74) *Attorney, Agent, or Firm*—Harness, Dickey & Pierce

(57) ABSTRACT

A single-ended low pass filter and its double-ended or balanced version comprising a first coil (Lp1) coupled between a first input (Vin1) and a first output (Vout1) terminal of the filter, a second coil (Lp2) coupled between a second input (Vin2) and a second output (Vout2) terminal of this filter, and a capacitor (C) coupled between the first and second output terminals. The single-ended or balanced low pass filter further includes filter enhancement means (FEM) comprising a current sense circuit (CS) having first inputs coupled across a first impedance (Rsense1) coupled between the first input terminal and the first coil, second inputs coupled across a second impedance (Rsense2) coupled between the second input terminal and the second coil, and an amplifier (A) having an input coupled to an output of the current sense circuit and having an output connected to a ground terminal (Vgrd) via a third (Ls1) and a fourth (Ls2) coils, preferably mounted in parallel and also forming part of the filter enhancement means. The coils are magnetically coupled by pairs and are located on a same core of a transformer (T1). This filter is used in xDSL splitters. The amplifier may comprise the cascade coupling of a frequency dependent amplifier and a transconductance amplifier. The coil is then enhanced in value and is made frequency dependent, giving a multiple order low pass filter.

7 Claims, 3 Drawing Sheets

MULTIPLE ORDER LOW PASS FILTER FOR AN XDSL SPLITTER IN A TELECOMMUNICATION SYSTEM

The present invention relates to a single-ended low pass filter comprising a coil coupled between an input terminal and an output terminal, and a capacitor coupled between said output terminal and a ground terminal.

Such a basic single-ended low pass filter is generally known and used in the art.

The same concept is for instance used as low pass filter in splitters in an xDSL telecommunication system. However, in such an application, a balanced or differential low pass filter is preferred.

Therefore, although not excluding as object on the invention the above mentioned single-ended low pass filter, the latter invention further relates to a balanced low pass filter comprising a first coil coupled between a first input and a first output terminal of said filter, a second coil coupled between a second input and a second output terminal of said filter, and a capacitor coupled between said first and said second output terminals. Generally, the first and second coil have a common magnetic core.

It is to be noted that the balanced low pass filter is mainly an extrapolation of the principle of the above single-ended low pass filter and that the present invention applies to both designs.

It is further obvious that for an application such as the xDSL telecommunication system, the known low pass filter needs to be enhanced in order to achieve xDSL requirements.

Two basic solutions exist on the market for the implementation of the low pass filter of the xDSL splitter:

a passive solution based on more coils (inductors) and capacitors; and an active solution based on integrated circuits comprising gyrator blocks.

Additionally to the relative high cost of the known passive solution, it is a bulky solution due to size of the coils which does not allow further size reduction for higher density. This passive solution for instance requires 3 filter coils and 4 capacitors to achieve a $5^{th}$ order low pass filter.

The active solution has the advantage of a smaller size, but is mainly based on series semiconductor elements in the 2 telephone wires, with following disadvantages:

a voltage drop (typically 2 Volt in each of the wires) across the semiconductor blocks in series, reducing the feeding voltage of the telephone set;

a crossover distortion in the series elements, when the current through the telephone wires is zero (e.g. zero-crossing during ringing, on hook transmission);

the semiconductor circuits are directly exposed to over-voltages and over-currents on the telephone wires (lightning, power induction, . . . ); and a relatively high production cost.

This active solution is further not yet available for volume deployment due to the above disadvantages.

An object of the present invention is to provide a low pass filter of the above known type but which allows an higher density (smaller components), an higher flexibility (easy adaptation, programmability), and that can be produced at lower cost.

According to the invention, this object is achieved due to the fact that said single-ended low pass filter further includes filter enhancement means comprising an impedance coupled between said input terminal and said coil, and an amplifier having inputs coupled across said impedance and having an output connected to said ground terminal via a second coil also forming part of said filter enhancement means, and that the first mentioned coil and said second coil respectively constitute the primary and secondary winding of a transformer.

On the other hand, this object is also achieved due to the fact that said balanced low pass filter further includes filter enhancement means comprising a current sense circuit having first inputs coupled across a first impedance coupled between said first input terminal and said first coil, second inputs coupled across a second impedance coupled between said second input terminal and said second coil, and an amplifier having an input coupled to an output of said current sense circuit and having an output connected to a ground terminal via a third and a fourth coils also forming part of said filter enhancement means, that said third coil is adapted to be magnetically coupled to said first coil, that said fourth coil is adapted to be magnetically coupled to said second coil, and that said first, second, third and fourth coils are located on a same core of a transformer.

In this way, the coil value in the filter is enhanced (increased or decreased) by sensing the current flowing through it, amplifying this current, and feeding it back to a secondary winding (third and fourth coil) of the transformer. By applying this enhancement to the low pass filter, it is possible to realize a multiple order low pass filter, based on a single coil (transformer) and capacitor, which is normally only a $2^{nd}$ order low pass filter.

In a preferred characterizing embodiment of the present invention, said third and fourth coils of the balanced low pass filter are coupled in parallel between the output of said amplifier and said ground terminal.

Other designs are obviously also possible, such as for instance the third and fourth coils series coupled between the output of the amplifier and the ground terminal.

In another preferred characterizing embodiment of the present invention, said single-ended low pass filter includes filter enhancement means comprising a current sense circuit having inputs connected across an impedance coupled between said input terminal and said coil, and an amplifier having an input coupled to an output of said current sense circuit and having an output connected to said ground terminal via a second coil also forming part of said filter enhancement means, and the first mentioned coil and said second coil respectively constitute the primary and secondary winding of a transformer.

Another characterizing feature of the present invention, applicable to both the single-ended and the balanced low pass filter, is that said amplifier comprises the cascade coupling of a frequency dependent amplifier and a transconductance amplifier adapted to translate the output voltage of said frequency dependent amplifier into a corresponding current.

The result is that the value of the coil in the low pass filter is enhanced in value and is made frequency dependent, giving a multiple order low pass filter. The order of the low pass filter is dependent on the order of the filter in the so-created feedback loop (filter for the sensed current).

All this results in a smaller size, lower cost and more flexible implementation of the low pass filter, e.g. of an xDSL splitter.

Further characterizing embodiments of the present single-ended and balanced low pass filter are mentioned in the appended claims.

It is to be noticed that the term 'comprising', used in the claims, should not be interpreted as being restricted to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being restricted to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

The above and other objects and features of the invention will become more apparent and the invention itself will be best understood by referring to the following description of an embodiment taken in conjunction with the accompanying drawings wherein.

Figure 1:
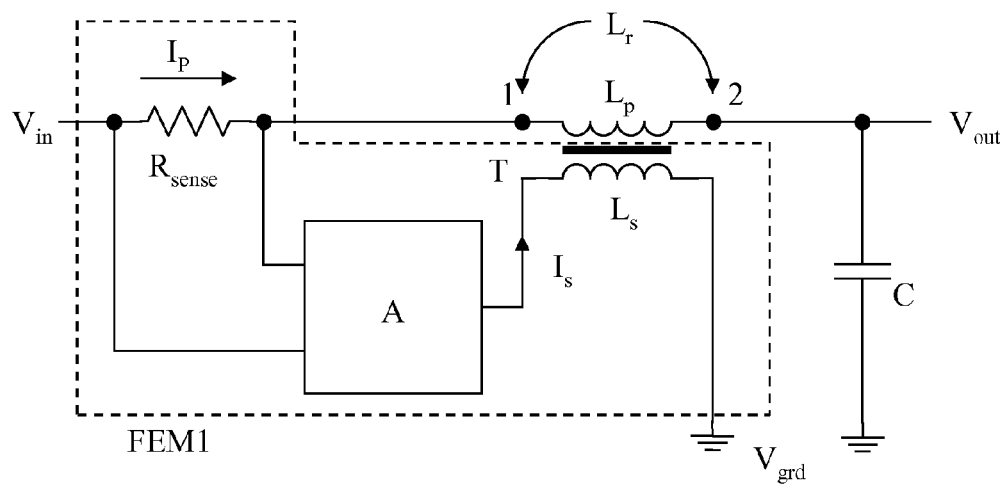
FIG. 1 represents a single-ended low pass filter with filter enhancement means according to the invention.

The low pass filter shown at FIG. 1 is a single-ended version of a filter that may for instance be used in an xDSL telecommunication system. The low pass filter has an input terminal Vin and an output terminal Vout with respect to a ground terminal Vgrd. A coil Lp has a first node 1 coupled to the input terminal Vin via an impedance, preferably constituted by a sensing resistor Rsense, and has a second node 2 connected to the output terminal Vout. The filter further comprises a capacitor C connected between the output terminal Vout and the ground terminal Vgrd. The low pass filter also includes a filter enhancement circuit FEM1 constituted by the impedance Rsense, an amplifier A and a second coil Ls. The amplifier A has inputs connected across the impedance Rsense and has an output connected to the ground terminal Vgrd via the second coil Ls. The first coil Lp and the second coil Ls respectively constitute the primary and secondary winding of a transformer T.

The basic idea of the present invention is to modify the filter characteristic of a $2^{nd}$ order low pass filter constituted by the single coil or inductor Lp and the capacitor C. This modification is achieved by:

sensing the current Ip flowing through the coil Lp by measuring the voltage across resistor Rsense;

amplifying and filtering of this current Ip by means of the amplifier A; and feeding an amplified and filtered current Is at the output of the amplifier A back to a secondary winding Ls of transformer T, consisting of the coils Lp and Ls.

The operation of the single-ended low pass filter of FIG. 1 will be described in more detail below, wherein Ip is the current flowing through resistor Rsense and coil Lp.

The current Ip is sensed across Rsense and is amplified in amplifier A, resulting in a current Is.

The current Is is fed back to the second coil or inductor Ls, which forms the secondary winding of the transformer T, of which inductor Lp is the primary winding.

The current Is is given by the following formula:

$$I_S = A \cdot I_P$$

The current Is in the coil Ls influences the magnetic field in the core of the transformer T in such a way that the resulting coil Lr, between the nodes 1 and 2, can be described by the following formula:

$$L_R = L_P + n \cdot A \cdot L_S$$

Where n is the winding ratio of transformer T, which is given by the following formula ($n_P$ is the number of windings of Lp and $n_s$ is the number of windings of Ls):

$$n = \frac{n_P}{n_S} = \sqrt{\frac{L_P}{L_S}}$$

The filter characteristic (in function of frequency ω) without Ls and without feedback (filter characteristic for $2^{nd}$ order filter composed of coil Lp and C) is given by:

$$\frac{V_{OUT}}{V_{IN}} = \frac{1}{1 + \omega^2 \cdot L_P \cdot C}$$

The filter characteristic (in function of frequency ω) with Ls and feedback via amplifier A present, is given by:

$$\frac{V_{OUT}}{V_{IN}} = \frac{1}{1 + \omega^2 \cdot L_R \cdot C} = \frac{1}{1 + \omega^2 \cdot (L_P + n \cdot A \cdot L_S) \cdot C}$$

As such, the coil Lr, that defines the filter characteristic of the total filter, can be adapted by adjusting Ls and the characteristics of the amplifier A.

Depending on the amplification in amplifier A and the winding ratio of transformer T, different adaptations of the coil are possible:

for $-1 < (n \cdot A) < 0$, i.e. current Is fed back to the coil Ls in opposite phase to the current Ip in the coil Lp, the resulting coil Lr is smaller than the original coil Lp. This is called the "suppressed" coil mode. The condition $(n \cdot A) \leq -1$ has to be avoided as this will make the circuit instable;

for $(n \cdot A) > 0$, i.e. current Is fed back to the coil Ls in phase with the current Ip in the coil Lp, the resulting coil Lr is larger than the original coil Lp. This is called the enhanced coil mode; and Also complex values of the amplification of amplifier A ($A_r + j \cdot A_i$) are possible, representing a possible phase shift of the current Is and Ip of 0° to 360°. Ar is the real part of amplification A, Ai is the imaginary part of amplification A.

In order to realize a multiple (higher) order low pass filter, still based on a single coil and capacitor, the amplifier A preferably comprises the cascade coupling (not shown) of a frequency dependent amplifier, say A(ω) and a transconductance amplifier, say $g_m$. The transconductance amplifier translates the output voltage of the frequency dependent amplifier into a corresponding current.

By making the amplification A, from current Ip to current Is, frequency dependent, the resulting coil Lr also becomes frequency dependent. As such, a multiple order filter is generated. The order of the low pass filter is dependent on the order of the filter in the so-created feedback loop.

Figure 2:
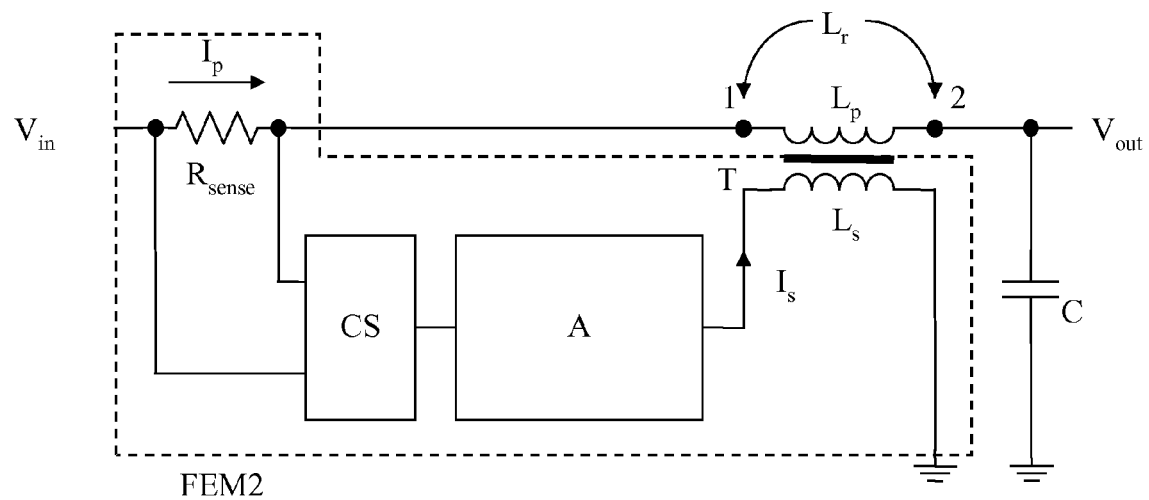
FIG. 2 represents a higher order variant of the single-ended low pass filter of FIG. 1.

The block diagram of a higher order low pass filter is given at FIG. 2. Therein, the amplification of the current Ip towards current Is is defined by following items, forming part of the filter enhancement means FEM2:

a current sense circuit or sense amplifier CS having inputs connected across the impedance Rsense and an output coupled to the input of the amplifier A, and more particularly of the frequency dependent amplifier $A(\omega)$ thereof. The frequency independent sense amplifier CS translates the current Ip into a corresponding voltage at the sense amplifier output; and the amplifier A comprising the frequency dependent amplifier $A(\omega)$ and the $g_m$ amplifier (transconductance amplifier) which translates the output voltage of amplifier $A(\omega)$ into a corresponding current Is.

When the amplifier A represents a high pass filter, giving coil enhancement at high frequencies, of order $O_A$. The total order $O_T$ of the filter is given by:

$$O_T = 2 + O_A$$

The resulting coil Lr changes its value of frequency with order $O_A$, the order of 2 is inherently present in the low pass filter consisting of coil Lp and capacitor C.

It is to be noted that besides using a high pass filter for amplifier A, other filters are possible, like band pass filter, to obtain the required frequency response of the filter.

Figure 3:
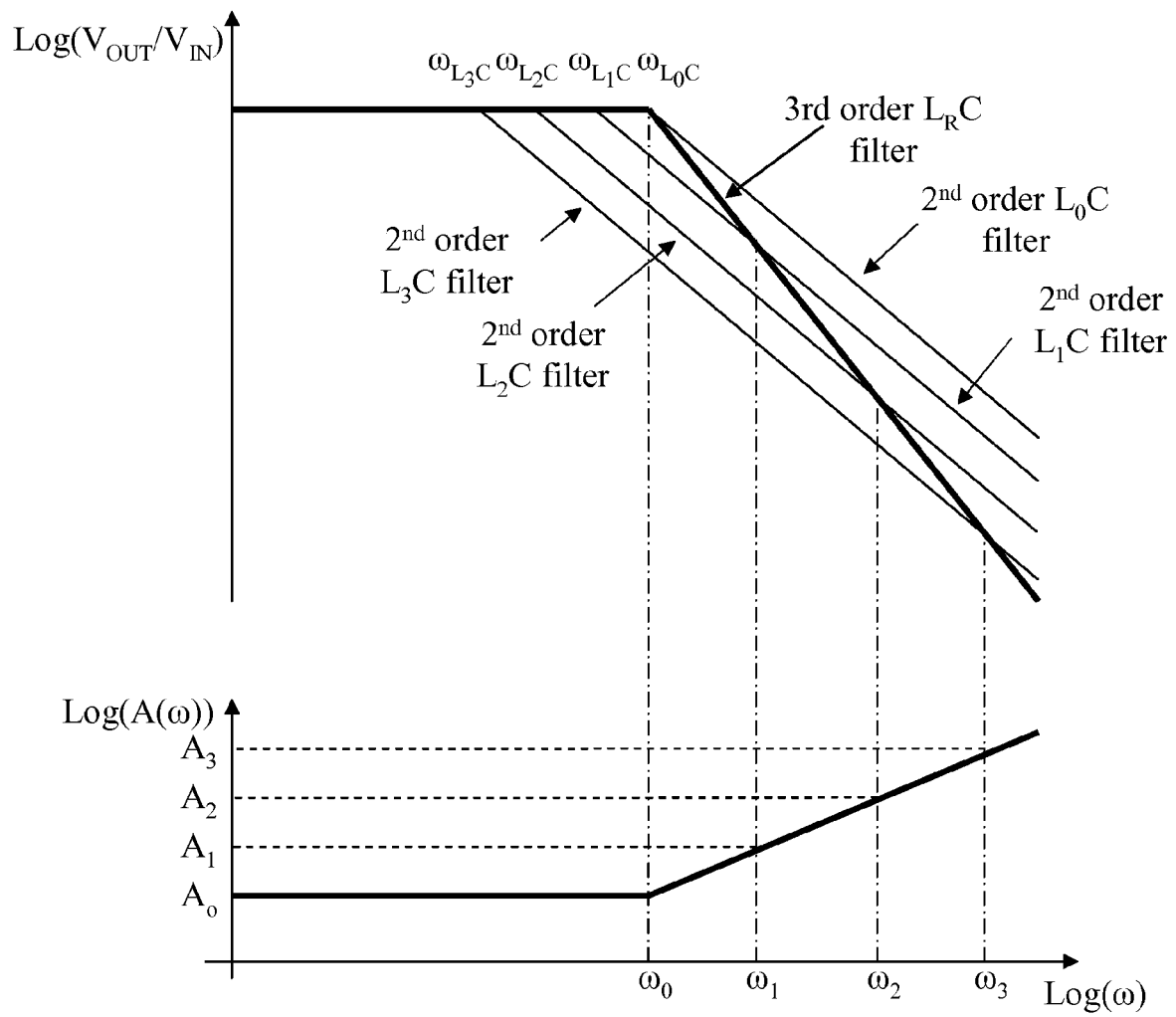
FIG. 3 shows frequency characteristic of a $3^{rd}$ order low pass filter enhanced according to the invention.

FIG. 3 gives an example of the frequency response of the total low pass filter of $3^{rd}$ order based on a $1^{st}$ order high pass filter in the amplifier A. Therein, the following applies:

$A_i$ is the amplification of $A(\omega)$ at frequency $\omega_i$, with i=0, 1, 2, 3

$$L_R = L_P + n \cdot A(\omega) \cdot L_S$$

$$L_i = L_P + n \cdot A_i \cdot L_S \text{ with } i = 0, 1, 2, 3$$

$$\omega_{L_i C} = \frac{1}{\sqrt{L_i \cdot C}} \text{ with } i = 0, 1, 2, 3$$

The frequency characteristic of the total filter, based on resulting coil Lr and capacitor C, follows a $3^{rd}$ order characteristic, as the frequency characteristic moves from the $2^{nd}$ order characteristic based on $L_0 C$ to the $2^{nd}$ order characteristic based on $L_3 C$ as the frequency increases from $\omega_0$ to $\omega_3$.

The same applies for higher order and band pass filter characteristics of amplifier $A(\omega)$.

The above-described principle is applied for the implementation of the low pass filter in the splitter function of an xDSL telecommunication system. A block-diagram of a low pass filter used in xDSL is given at FIG. 4. The main difference compared to the implementation of FIG. 2 is that the splitter filter is balanced or double-ended, with 2 sense resistors Rsense1 and Rsense2 and a double-ended transformer T1. Moreover, therein, the filter and amplifier block, i.e. the filter enhancement means, are designed to comply with the standards for the xDSL splitter.

Figure 4:
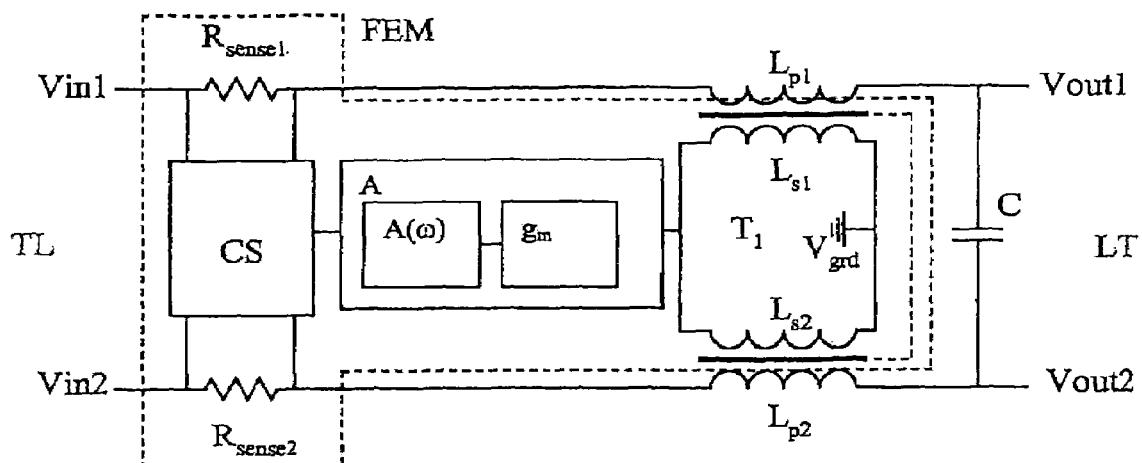
FIG. 4 represents a balanced version of the low pass filter.

In more detail, the balanced or differential low pass filter of FIG. 4 comprises a first coil Lp1 coupled between a first input Vin1 and a first output Vout1 terminal of this filter, a second coil Lp2 coupled between a second input Vin2 and a second output Vout2 terminal of this filter, and a capacitor C coupled between the first and the second output terminals. This balanced low pass filter further includes filter enhancement means FEM comprising a current sense circuit CS having first inputs coupled across a first impedance Rsense1 coupled between the first input terminal Vin1 and the first coil Lp1, second inputs coupled across a second impedance Rsense2 coupled between the second input terminal Vin2 and the second coil Lp2, and an amplifier A having an input coupled to an output of the current sense circuit and having an output connected to the ground terminal Vgrd via third Ls1 and fourth Ls2 coils also forming part of the filter enhancement means. In the xDSL application, the first Vin1 and second Vin2 input terminals of the filter are coupled to a telecommunication line TL, whilst the first Vout1 and second Vout2 output terminals of this filter are coupled to a line terminal LT that is a POTS or an ISDN termination.

The first coil Lp1, the second coil Lp2, the third coil Ls1 and the fourth coil Ls2 are magnetically coupled and are located on a same core of the transformer T1.

In a preferred embodiment, as shown at FIG. 4, the third Ls1 and fourth Ls2 coils are coupled in parallel between the output of the amplifier A and the ground terminal Vgrd. However, other designs are possible, such as for instance the third and fourth coils series coupled between the output of the amplifier and the ground terminal.

Similarly to the single-ended low pass filter of FIG. 2, the amplifier A of the balanced low pass filter of FIG. 4 preferably comprises the cascade coupling (not shown) of a frequency dependent amplifier $A(\omega)$ and a transconductance amplifier $g_m$ adapted to translate the output voltage of the frequency dependent amplifier into a corresponding current.

The principle of the above-described filter allows for an implementation (e.g. by integration) that makes the filter characteristics of the filter enhancement means of FIG. 4 programmable (e.g. by software), to improve the flexibility by adjusting the filter characteristics of the whole low pass filter. This allows reducing the number of version of the wide variety of splitters that is required today for different applications and markets.

Figure 5:
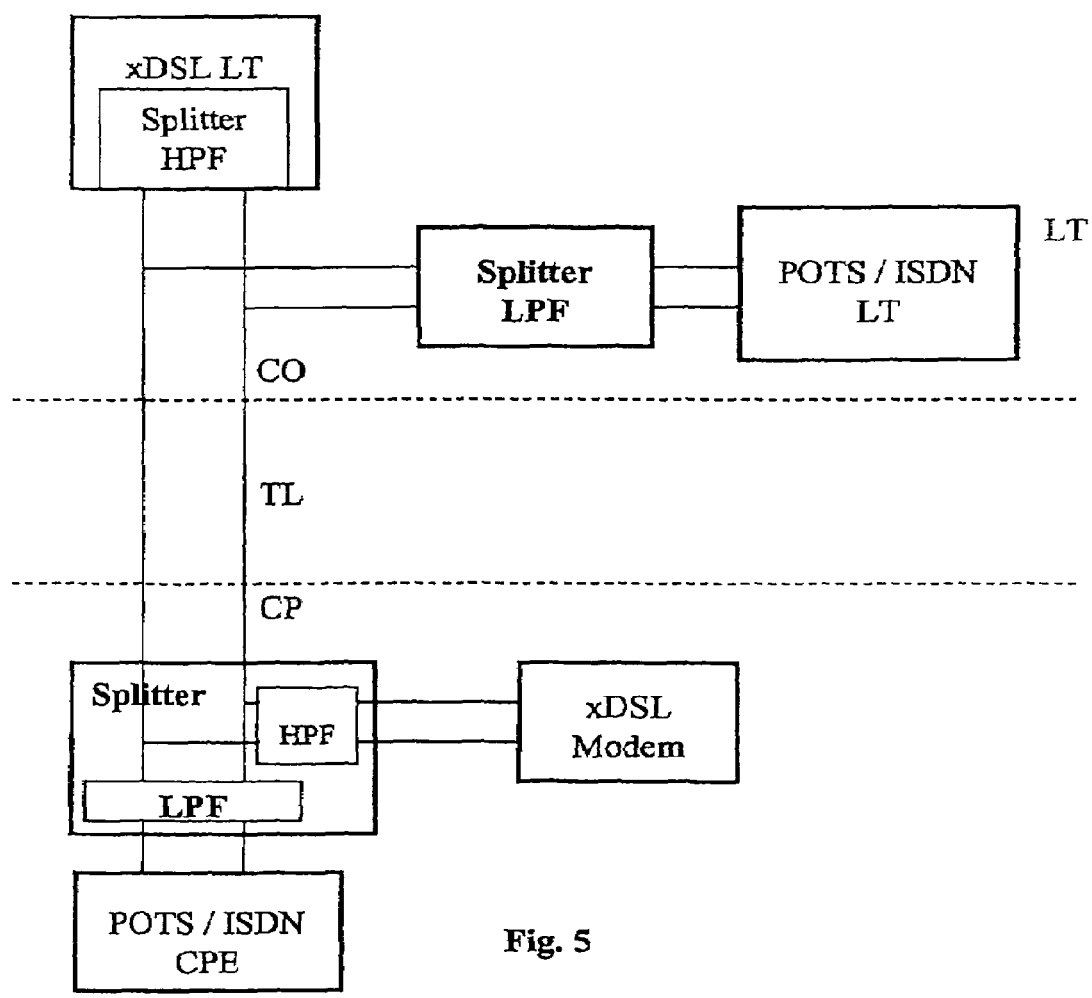
FIG. 5 shows an xDSL telecommunication system comprising a low pass filter according to the invention.

FIG. 5 gives a block-diagram of an implementation of the present low pass filter in an xDSL splitter.

At the Central Office CO side, the splitter function in an xDSL environment allows frequency multiplexing of the low frequency band (POTS or ISDN) and the high frequency band (xDSL like ADSL, VDSL) on the same telephone line TL. Therefore, the xDSL splitter consists of a high pass filter (most often placed on the xDSL line termination board) and a low pass filter (most often placed on separate boards).

At the Customer Premises CPE, also a splitter function, consisting of a low and high pass filter, is present for frequency multiplexing of the POTS/ISDN signals towards the POTS/ISDN terminal LT and the xDSL signals towards the xDSL modem.

This topology of xDSL and POTS/ISDN frequency multiplexing is shown at FIG. 5, wherein the following abbreviations are used:

LT=Line Termination;
LPF=Low Pass Filter;
HPF=High Pass Filter;
CPE=Customer Premises Equipment;
CP=Customer Premises;
TL=Telecommunication Line;
CO=Central Office;
POTS=Plain Old Telephone Services; and
ISDN=Integrated Services Digital network.

Owing to the different implementations described above, it is possible to achieve the following advantages:

small size (only 1 coil) compared to passive splitter implementations;

less costly, especially on bulky components (coils, high voltage capacitors);

insensitive to over-voltages and over-currents on the telephone line (high Ohmic current sense network and galvanic isolation via the Transformer T1);

no crossover distortion (in zero-crossing of the wires of the telephone line) as often encountered in other active splitter implementations;

no DC voltage drop, as is present on other active splitter implementations; and flexible programming of the filter characteristics.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is merely made by way of example and not as a limitation on the scope of the invention, as defined in the appended claims.

The invention claimed is:

1. A balanced low pass filter comprising:
a first coil coupled between a first input and a first output terminal of said filter;
a second coil coupled between a second input and a second output terminal of said filter; a capacitor coupled between said first and said second output terminals;
a current sense circuit having first inputs coupled across a first impedance coupled between said first input terminal and said first coil, second inputs coupled across a second impedance coupled between said second input terminal and said second coil, and
an amplifier having an input coupled to an output of said current sense circuit and having an output connected to a ground terminal via third and fourth coils forming part of a filter enhancement means, said third coil being magnetically coupled to said first coil, said fourth coil being magnetically coupled to said second coil, said first, second, third and fourth coils being located on a same core of a transformer, wherein said amplifier includes a cascade coupling of a frequency dependent amplifier and a transconductance amplifier configured to translate an output voltage of said frequency dependent amplifier into a corresponding current.

2. The balanced low pass filter according to claim 1, wherein said third and fourth coils are coupled in parallel between the output of said amplifier and said ground terminal.

3. An xDSL telecommunication system comprising
a low pass filter splitter, wherein
said low pass filter splitter is said balanced low pass filter according to claim 2,
said first and second input terminals are coupled to a telecommunication line, and
said first and second output terminals are coupled a telephone line termination.

4. The xDSL telecommunication system according to claim 3, wherein said low pass filter splitter is located at the Central Office of said telecommunication system.

5. The xDSL telecommunication system according to claim 3, wherein said low pass filter splitter is located at the Customer Premise Equipment of said telecommunication system.

6. The xDSL telecommunication system according to claim 3, characterized in that said telephone line termination is a Plain Old Telephone System.

7. The xDSL telecommunication system according to claim 3, characterized in that said telephone line termination is an Integrated Services Digital Network.

* * * * *